United States Patent
Sestok, IV et al.

(10) Patent No.: US 10,191,097 B2
(45) Date of Patent: Jan. 29, 2019

(54) SQUARE-WAVE-BASED IMPEDANCE ANALYSIS

(71) Applicant: TEXAS INSTRUMENTS INCORPORATED, Dallas, TX (US)

(72) Inventors: Charles Kasimer Sestok, IV, Dallas, TX (US); Srinath Ramaswamy, Murphy, TX (US); Anand Ganesh Dabak, Plano, TX (US); Domingo G. Garcia, Plano, TX (US); Baher Haroun, Allen, TX (US); Alan Henry Leek, Frisco, TX (US); Ryan Michael Brown, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 176 days.

(21) Appl. No.: 15/389,053

(22) Filed: Dec. 22, 2016

(65) Prior Publication Data
US 2018/0180652 A1  Jun. 28, 2018

(51) Int. Cl.
*G01R 27/16* (2006.01)

(52) U.S. Cl.
CPC .................. *G01R 27/16* (2013.01)

(58) Field of Classification Search
CPC .... G01R 27/16; G01R 27/14; G01R 31/3679; G01R 21/12
USPC ...... 324/600, 603–626, 763.01, 520, 757.02, 324/756.07, 537, 754.06–754.31, 555, 324/500, 323, 337; 702/182, 124–127, 702/57, 63–65, 81, 118, 183
See application file for complete search history.

(56) References Cited

U.S. PATENT DOCUMENTS

| | | | |
|---|---|---|---|
| 4,041,382 A | 8/1977 | Washburn | |
| 5,297,425 A * | 3/1994 | Hamby | E21B 47/10 73/152.18 |
| 8,604,809 B2 * | 12/2013 | Eilersen | G01R 27/2605 324/658 |
| 2001/0010467 A1 | 8/2001 | Oguma et al. | |
| 2005/0072874 A1 | 4/2005 | Denen et al. | |
| 2006/0182231 A1 | 8/2006 | Tan et al. | |
| 2007/0268012 A1 | 11/2007 | Kawabata | |
| 2008/0303538 A1 | 12/2008 | Orr | |

(Continued)

OTHER PUBLICATIONS

Chen, Chiouguey J., "Modified Goertzel Algorithm in DTMF Detection Using the TMS320C80," Texas Instruments Application Report, SPRA066, Jun. 1996 (19 pages).

(Continued)

*Primary Examiner* — Melissa Koval
*Assistant Examiner* — Trung Nguyen
(74) *Attorney, Agent, or Firm* — Michael A. Davis, Jr.; Charles A. Brill; Frank D. Cimino

(57) ABSTRACT

A microcontroller-based system for measuring the impedance of a device under test (DUT), responsive to a square wave stimulus, includes parallel stimulus signal paths, selectable by a switch, that can correspond to different stimulus frequency ranges. At least one of the paths includes an off-chip PLL and integer divider circuit to modify the frequency of the stimulus. A discrete Fourier transform executed by a processor is used to determine the impedance of the DUT at the stimulus frequency. Multiple frequencies can be analyzed at the same time by using a summation circuit and/or by analyzing odd harmonics of the stimulus frequency.

20 Claims, 5 Drawing Sheets

(56) References Cited

U.S. PATENT DOCUMENTS

2011/0074392 A1  3/2011  Bartlett et al.
2011/0115509 A1  5/2011  Kim et al.
2011/0227587 A1  9/2011  Nakanishi et al.
2014/0145729 A1  5/2014  Sobolewski
2016/0077140 A1  3/2016  Todi et al.
2016/0274060 A1  9/2016  Denenberg et al.

OTHER PUBLICATIONS

Mock, Pat, "Add DTMF Generation and Decoding to DSP-uP Designs," Texas Instruments Application Report, SPRA168, copyright 1997 (19 pages).

CDCE(L)913: Flexible Low Power LVCMOS Clock Generator with SSC Support for EMI Reduction, Texas Instruments datasheet dated Jun. 2007, revised Oct. 2016; located at http://www.ti.com/lit.ds.symlink/cdce913.pdf(35 pages).

* cited by examiner

SQUARE-WAVE-BASED IMPEDANCE ANALYSIS

TECHNICAL FIELD

This disclosure relates to electronic circuits and methods for square-wave-based impedance analysis. More particularly, this disclosure relates to a providing square-wave-based impedance analysis having parallel signal paths for improved frequency range and scan time.

BACKGROUND

The electrical impedance of an electrical circuit or circuit component is the opposition to current that the circuit or component presents to an applied voltage. Impedance can be a complex quantity, namely the sum of a resistance and a reactance, and can vary with the frequency of the applied voltage. Knowledge of impedance aids in determining the efficiency with which energy is delivered to the load of a circuit. Impedance measurement and analysis can be used in electronic sensors, for example, in determining the properties of a material or workpiece, or conditions of the surrounding environment.

Impedance analyzers can operate by applying a sinusoidal stimulus to the circuit or component under measurement, referred to herein as the "device under test" (DUT), and measuring the electrical response of the DUT to the applied sinusoid waveform. The response may be measured at more than one frequency of the sinusoidal stimulus, for example, over a sweep of input frequencies. The use of a single-frequency sinusoid as the measurement stimulus at each of the frequencies of interest greatly simplifies the measurements, as harmonic interference in the response of the DUT is largely avoided.

Microcontroller-based sensors can be used for the measurement and analysis of electrical impedance. Microcontrollers are large-scale electronic integrated circuits (ICs) that include the computational capability for controlling and managing a wide range of functions and useful applications, including integrating all necessary functional components of a computer system, whether general-purpose or arranged for a particular end application. In some implementations, such microcontrollers are referred to as a "system on a chip" (SoC) device. Some microcontroller architectures include one or more processor cores that carry out the digital computer functions of retrieving executable instructions from memory, performing arithmetic and logical operations on digital data retrieved from memory, and storing the results of those operations in memory. Other digital, analog, mixed-signal, or even RF functions may also be integrated into the same integrated circuit for acquiring and outputting the data processed by the processor cores.

SUMMARY

In an example, an impedance analyzer to analyze the impedance of a device under test (DUT) over a range of frequencies includes parallel signal transmission paths between a microcontroller and the DUT. The microcontroller generates a first square wave signal at a first frequency. Each parallel path transmits one of the first square wave signal or a square wave signal based on the first square wave signal. The parallel paths include a first path comprising a first anti-aliasing filter for filtering the first square wave signal to remove frequencies higher than a first filter frequency. The first path is to deliver the first square wave signal to the DUT. The parallel paths also include a second path comprising a clock synthesizer integrated circuit (IC), separate from the microcontroller, to generate a second square wave signal, based on the first square wave signal, at a second frequency. The second path has a second anti-aliasing filter for filtering the second square wave signal to remove second frequencies higher than a second filter frequency, the second filter frequency being higher than the first filter frequency. A path selection switch, controllable by the microcontroller, selects one of the parallel paths.

In another example, a method of measuring an impedance of a DUT includes generating a clock signal at a frequency. The method further includes selecting one of a plurality of parallel signal transmission paths between a microcontroller and the DUT by adjusting a switch connecting the selected path to the DUT. The selected stimulus signal transmission path includes, separate from the microcontroller, a fractional phase-locked loop (PLL) and an integer divider circuit. The PLL and divider circuit modify the frequency of the clock signal to generate a square wave stimulus signal at a stimulus frequency. The square wave stimulus signal is applied to the DUT via the selected path. A resultant signal corresponding to the response of the DUT to the square wave stimulus signal is sampled at a sampling frequency to produce a sample stream. The discrete Fourier transform (DFT) of samples of the sample stream is computed to determine the impedance of the DUT from a magnitude and phase result of the DFT at a selected bin corresponding to the stimulus frequency.

In yet another example, a method of impedance analysis of a DUT includes completing an initial measurement phase that consists of selecting a first target frequency, generating a square wave stimulus signal at the first target frequency, delivering the stimulus signal to the DUT, and sampling a response signal from the DUT to generate an initial measurement data set. A processor performs an analysis phase on the initial measurement data set. The analysis phase consists of windowing the measurement data set, computing a discrete Fourier transform (DFT) of the windowed data, selecting a bin of the computed DFT corresponding to the first target frequency, and identifying the impedance of the DUT at the first target frequency based on the computed selected bin. The bin selection and impedance identification of the analysis phase are repeated for a second analysis frequency that is an odd harmonic of the first target frequency. The repeated analysis phase is based on the initial measurement data set, and is performed at least in part simultaneous to performance of a second measurement phase for a second target frequency.

DETAILED DESCRIPTION

A microcontroller-based system for measuring the impedance of a device under test (DUT), responsive to a square wave stimulus, can include parallel stimulus signal paths that can correspond to different stimulus frequency ranges. At least one of the paths can include circuitry to modify the frequency of the stimulus, e.g., an off-chip PLL and integer divider circuit. A discrete Fourier transform (DFT) executed by a processor can be used to determine the impedance of the DUT at the stimulus frequency. Multiple frequencies can be analyzed at the same time by using a summation circuit and/or by analyzing odd harmonics of the stimulus frequency counter.

This disclosure describes devices and methods that increase the frequency range and reduce the scan time of impedance analysis when such analysis is based on square waves, such as may be generated by a general-purpose input/output (GPIO) circuit. The examples described herein can use off-chip clock multiplication and division to increase the effective frequency range of the transmitted signal at a lower cost when compared to square-wave-based impedance analyzers that may use a digital-to-analog converter (DAC) driven by a direct digital synthesis (DDS) sinusoidal signal, or a GPIO without external clock multiplication, wherein frequency scans are limited to one test frequency at a time. In examples described herein, impedance analysis scan times can be reduced by adding multiple square waves of different frequencies, and by computing impedance estimates at the harmonics of the square wave as well as at the fundamental frequency. U.S. patent application Ser. No. 15/344,565 is herein incorporated by reference.

Figure 1:
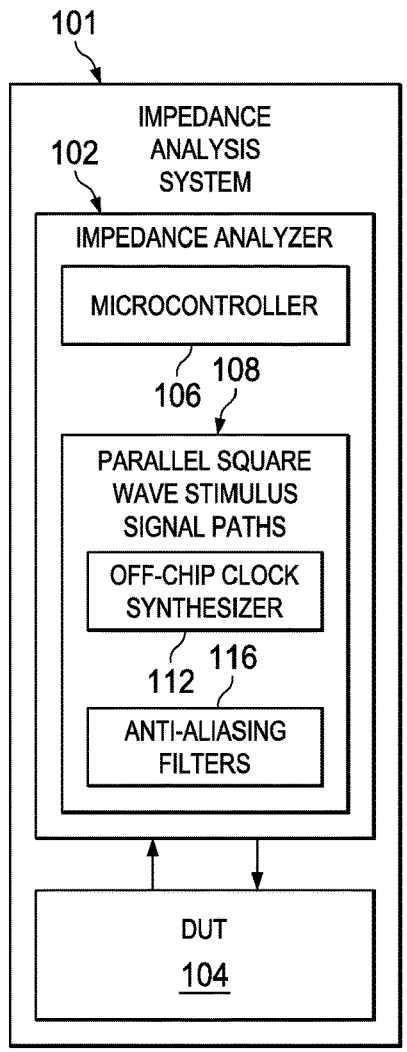
FIG. 1 shows an example impedance analysis system.

FIG. 1 depicts an example impedance analysis system 101 that includes a microcontroller-based impedance analyzer 102 and a device under test (DUT) 104. Impedance analyzer 102 can include a microcontroller 106 to generate a square-wave stimulus signals that can be applied to the DUT 104 for measurement of its impedance. The stimulus signals can be generated, for example, at one or more general-purpose input/output (GPIO) pins or ports of the microcontroller 106. The square-wave stimulus signals can be carried to the DUT 104 through parallel signal paths 108. The paths can include at least one off-chip clock synthesizer 112 and anti-aliasing filters 116 to provide paths for different frequency ranges of square-wave stimulus signals, for example, a path for signals of less than about 200 kHz and a path for signals of about 200 kHz to about 20 MHz.

Figure 2:
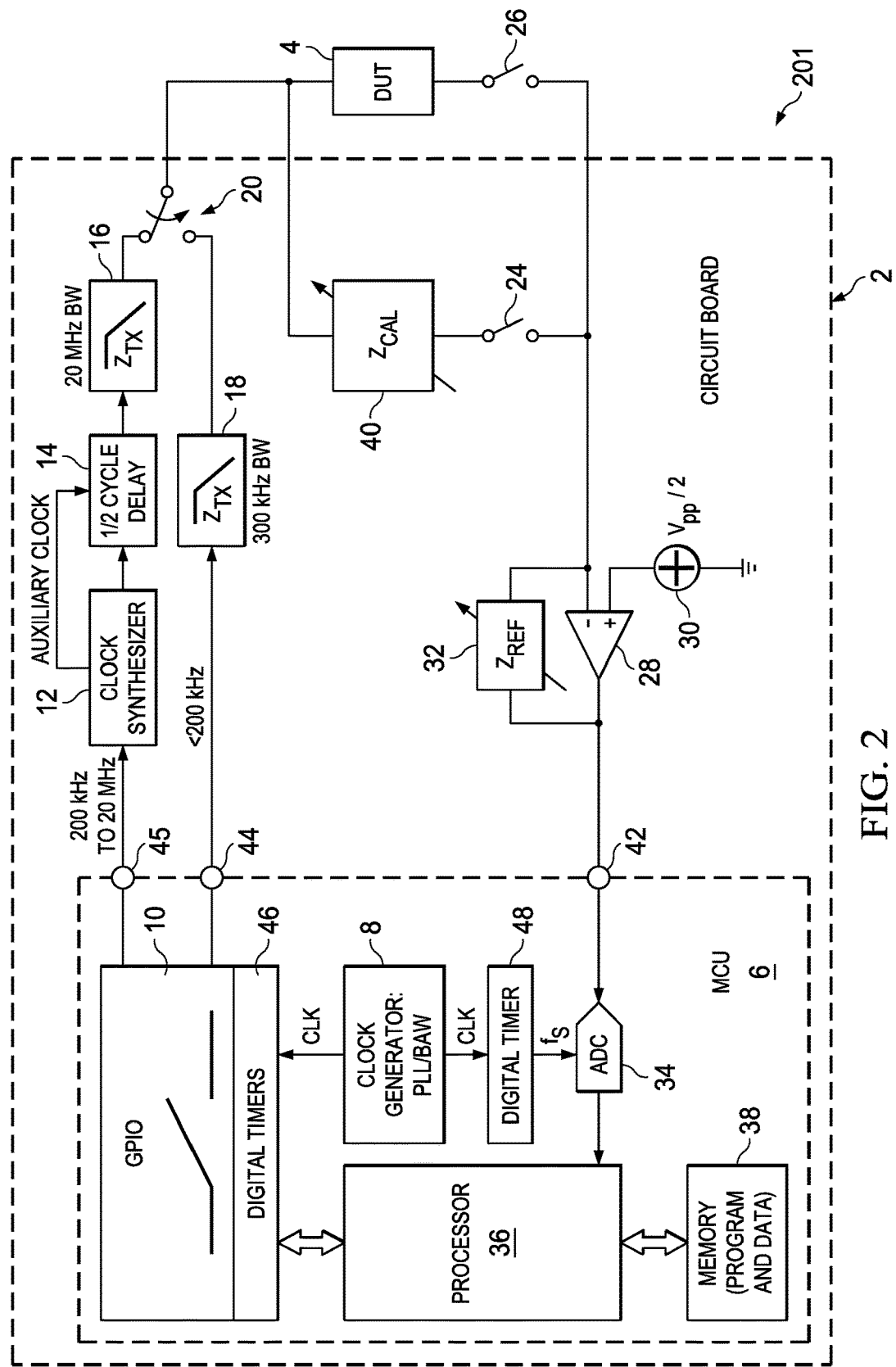
FIG. 2 shows example impedance analyzer connected to a device under test (DUT).

FIG. 2 illustrates an example microcontroller-based impedance analyzer 201, as may be implemented into a stand-alone sensor (e.g., in the "Internet of things," or IoT, context) or within a larger-scale system or equipment. The impedance analyzer 201 can be used to test the impedance of a device under test (DUT) 4, which is not included as part of the impedance analyzer 201 but rather is a component that can be permanently or temporarily attached to the impedance analyzer 201. Impedance analyzer 201 can consist, for example, of one or more components placed on a circuit board 2, or on multiple circuit boards. As illustrated, such components can include microcontroller unit (MCU) 6, antialiasing filters 16, 18, operational amplifier 28, reference impedance 32, and calibration impedance 40.

The DUT 4 can be a two-terminal device, having one terminal receiving a stimulus voltage (after filtering, if desired) and another terminal coupled to the inverting input of operational amplifier (op amp) 28. Op amp 28 can receive a reference voltage 30, for example at ½ the peak-to-peak amplitude of the stimulus voltage, at its non-inverting input. A reference impedance 32 can be connected in negative feedback fashion between the output of op amp 28 and its inverting input. The output voltage from the op amp can be received by the microcontroller 6, and converted to a digital signal by an analog-to-digital converter (ADC) 34, which, again, can be realized within the microcontroller 6. The resultant digital signal can be returned to a processor 36 in the microcontroller, which can then analyze the resultant signal in view of the square-wave stimulus to estimate or determine the impedance of the DUT 4. Although the estimates or determinations will have some distortion owing to the fact that the stimulus signals are square waves rather than sine waves, the sampling frequency of the ADC 34 can be adjusted to minimize the distortion present in impedance estimates or determinations.

In the arrangement shown in FIG. 2, the ratio of the op amp output voltage (i.e., at terminal 42) to the square-wave stimulus voltage applied at one terminal of the DUT 4 reflects the impedance of the DUT 4 relative to the impedance of the reference impedance 32 placed as feedback across the op amp 28. The op amp 28 can maintain a virtual ground at its inverting input, and as such the voltage drop across DUT 4 will be the input stimulus voltage. Additionally, because the input of the op amp 28 exhibits a significantly higher impedance than the feedback reference impedance 32, effectively all of the current conducted through the DUT 4 will pass through the feedback reference impedance 32. The op amp output voltage will thus be proportional to this DUT current conducted through the feedback reference impedance 32.

For example, if the impedance of the DUT 4 exactly matches the feedback reference impedance 32, the op amp output voltage will match the stimulus voltage. Accordingly, the impedance of the DUT 4 can be determined from the op amp output voltage. This measurement can be performed over a range of frequencies, for example using a processor 36 in the microcontroller to control a sweep of the frequency of the stimulus voltage applied to the DUT 4. The ADC 34 can sample and digitize the op amp output voltage representing the response of DUT 4 to the stimulus at each frequency, and a processor 36 in the microcontroller can analyze that sample stream, for example via a discrete Fourier transform (DFT), to determine the impedance of the DUT 4 at each frequency in the sweep. Both the amplitude and the phase of the op amp output voltage relative to the stimulus voltage can be considered in quantifying the inductive and capacitive components of the impedance of DUT 4.

The DUT 4 can also be connected in parallel with a calibration impedance 40 with switches 24, 26 selecting one or the other of these loads. The calibration impedance 40 can be a known precision impedance that is useful in calibrating the impedance measurement for non-idealities in the op amp 28 or presented by a test fixture used for retaining the DUT 4. The calibration impedance 40 may be a variable impedance device (e.g., a bank of selectable precision resistors) to provide accurate calibration over a wide range of impedances. Similarly, the reference impedance may also be a variable impedance so as to better match the expected impedance of the DUT 4.

A square-wave stimulus can be used, as opposed to a sinusoidal stimulus, for a variety of reasons. Generating a sinusoidal stimulus voltage would require microcontroller 10 to have a digital frequency synthesis component, which would in turn require the relatively costly circuitry of the digital frequency synthesis and a DAC to convert the digitally synthesized frequency signal to an analog signal for introduction into the DUT 4, especially if impedance is to be measured at reasonably high precision and at fine resolution. In particular, when a sinusoidal stimulus is used, the number of bits of resolution in the sample stream of the stimulus waveform, as well as the sample rate of that sample stream, translates directly into the complexity of the DAC circuit. Complex DAC circuits consume significant chip area, and can significantly increase the cost of the microcontroller device. This cost factor can be significant in modern embedded processors and SoC devices, and can limit the sensor applications for which impedance measurements can be performed. Use of a square-wave stimulus as shown in FIG. 2 can therefore reduce complexity and cost.

To this end, microcontroller unit (MCU) 6 can include functional circuitry for generating a stimulus waveform to be applied to a device under test (DUT) 4, and for analyzing the response of that device 4 to the stimulus in order to determine its electrical impedance. In this regard, microcontroller 6 can include at least one processor 36 (also referred to as a "processor core") capable of executing program instructions for carrying out at least some of the operations described herein. Although only one processor is shown in FIG. 2, microcontroller 6 may include multiple processors or processor cores, each of which may take on a subset of the operations described herein.

Microcontroller 6 can also include memory 38, and as such may include memory blocks of various types, including non-volatile memory (e.g., flash memory or other electrically programmable memory) capable of storing program instructions and configuration data for processor 36 and other functions in microcontroller 6, and also volatile memory (e.g., dynamic or static RAM) capable of storing data involved in those operations. Thus, even though memory is illustrated as a single unit in FIG. 2, there may be a plurality of memories, each of which may use different memory technologies. Some of memory 38 may be embedded within processor 36, or the several such processors. Examples of microcontroller devices that may be suitable for implementation as microcontroller 6 include the MSP and C2000x families of microcontrollers available from Texas Instruments Incorporated.

Microcontroller 6 can include general purpose input/output (GPIO) component 10, which can be coupled to one or more terminals of microcontroller 6 to provide input paths and/or output signals. GPIO 10 can include both input circuitry for receiving and forwarding a digital logic level from the one or more terminals, and driver circuitry for driving a digital voltage level at the one or more terminals. GPIO 10 can be configured and operate under program control, as executed by processor 36. The digital logic levels driven at the one or more terminals by GPIO 10 in its form as an output are constituted by a power supply voltage $V_{pp}$ and ground ($V_{ss}$, or 0 volts). Other digital output voltage levels may alternatively be output from GPIO 10, depending on the construction of the driver circuitry. GPIO 10 can be configured and can operate to drive multiple square wave signals at these two levels ($V_{pp}$, $V_{ss}$) that can serve as the stimulus applied to device under test (DUT) 4 to measure its electrical impedance.

Processor 36 can also be coupled to analog-to-digital converter (ADC) 34, which can in turn be coupled (via analog front end circuitry, not shown) to an input terminal 42 of microcontroller 6. ADC 34 can periodically sample and digitize the voltage at its input terminal 42, producing a sample stream that can be forwarded to processor 36. The voltage sampled by ADC 34 can represent the response of DUT 4 to the stimulus of a square wave signal applied from GPIO 10. Processor 36 can in turn execute the appropriate program instructions, for example as stored in memory 38, to determine an impedance measurement for DUT 4 from the sampled voltages. Processor 36 can then determine the impedance measurement by performing a discrete Fourier transform (DFT) on the sample stream acquired by ADC 34 from the response of DUT 4 to the applied stimulus.

As discussed previously, the stimulus applied to DUT 4 for the impedance measurement in the illustrated examples is not a sinusoid, but rather is a square-wave signal as can be generated by GPIO 10. Accordingly, microcontroller 6 may omit a digital frequency synthesis component or a DAC. A square wave can contain frequency components other than the single frequency of a sinusoid, which in this context can complicate the measurement of the electrical impedance of DUT 4. For some stimulus frequencies, the generation of the square wave stimulus and the timing of the sampling of the response can be based on the same clock signal at a relationship that accounts for lower harmonics of the fundamental square wave stimulus frequency. For other, higher-frequency square-wave stimulus signals, a different stimulus signal path can be used. The present disclosure will first describe the functioning of impedance analyzer 201 with respect to the lower-frequency stimulus signals. This will be followed by a description of the use of one or more alternate, parallel stimulus signal paths to achieve higher-frequency impedance analysis.

Still with reference to FIG. 2, clock generator circuitry 8 of microcontroller 6 can generate a relatively high-speed base clock signal CLK, at frequency $f_{CLK}$, on which both a square wave stimulus $V_{SW}$ and the sampling frequency $f_{ADC}$ applied by ADC 34 can be based. Clock generator circuitry 8 can be based, for example, on one or more of a phase-locked loop (PLL) or a bulk acoustic wave (BAW) resonator. Base clock frequency $f_{CLK}$ will be at a higher frequency than either the square wave stimulus frequencies or the sampling frequency $f_{ADC}$. As such, the stimulus and sampling frequencies can be generated within microcontroller 6 by relatively simple frequency divider functions, without requiring expensive and complex circuitry such as fractional phase-locked loops and the like within microcontroller 6 to generate signals at specific frequencies. On the stimulus side, base clock signal CLK can be applied to digital timers 46 associated with GPIO 10, which can divide down the frequency $f_{CLK}$ by an integer divisor to derive the timing of square wave stimulus signals. For example, digital timers 46 may include a digital counter that issues a control signal to GPIO 10 to begin a cycle of the square wave (e.g., issue a rising edge) upon the elapsing of a specified number of cycles of clock signal CLK. A second digital counter may also be included within digital timers 46 to define the duty cycle of the square wave stimulus, for example by controlling GPIO 10 to end a pulse (e.g., issue a rising edge) upon the elapsing of a specified number of cycles of clock signal CLK. As such, each of the period of the square wave stimulus provided by GPIO 10 and its duty cycle is derived as an integer number of cycles of clock signal CLK.

Similarly, a digital timer 48 can be provided in microcontroller 6 to control the sampling frequency $f_{ADC}$ at which ADC 34 samples the response voltage at its corresponding terminal 42. This digital timer 48 can control ADC 34 to sample and digitize the response voltage upon the elapsing of a specified number of cycles of base clock signal CLK. As such, sampling frequency $f_{ADC}$ can be divided down, by a selected integer divisor value, from the frequency $f_{CLK}$ of base clock signal CLK.

One or more terminals, such as terminal 44, can be driven by GPIO 10 to provide a square wave stimulus signal $V_{SQ}$ to the DUT 4. The provided stimulus signal $V_{SQ}$ can be processed by a corresponding anti-aliasing filter, such as anti-aliasing filter 18 to attenuate higher harmonics of the fundamental frequency of square wave stimulus signals. Filter 18 may be an off-chip (i.e., outside of microcontroller 6) analog low-pass filter of the desired frequency response. For example, filter 18 may be constructed as a 4th-order multiple feedback low-pass filter, or alternatively as any one of a number of filter architectures and topologies to attain the desired characteristic. Anti-aliasing filter 18 may alternatively be constructed as a band-pass frequency selective frequency filter, rather than as a low-pass filter. Anti-aliasing filter 18 may have a gain less than one in order to reduce the peak-to-peak voltage swing of the square wave stimulus signals as applied to DUT 4, to prevent signal saturation. In any case, anti-aliasing filter 18 can be provided to minimize the effect of higher harmonics of the square wave stimulus, so that these harmonics do not significantly contaminate the measured response of DUT 4 at the fundamental frequency of that stimulus waveform.

DUT 4 can be connected at the other side of anti-aliasing filter 18 from GPIO 10 to receive the filtered square wave stimulus signals from a selected signal path. To calibrate for temperature drifts and manufacturing variations in stimulus signal paths and reference impedance 32, DUT 4 can be connected in parallel with variable calibration impedance 40, with load selection switches 24, 26 provided in series with these loads 40, 4 to select one or the other for inclusion in the measurement circuit. Load selection switches 24, 26 can be collectively provided, for example, as a switching multiplexor. The functionality of load selection switches 24, 26 might also be implemented using a single switch to select from among multiple paths (as with signal path selection switch 20) rather than using multiple switches as illustrated. However implemented, load selection switches 24, 26 can in some examples be controlled by processor 36 or other control circuitry in the system to switch in calibration impedance 40 and switch out DUT 4 when performing calibration of the measurement system, and to switch out calibration impedance 40 and switch in DUT 4 for the impedance measurement.

An inverting amplifier circuit can receive and amplify the response of DUT 4 to the stimulus signals from GPIO 10. As shown in FIG. 2, DUT 4 (or calibration impedance 40, as the case may be) can be applied to an inverting input of differential operational amplifier 28. The non-inverting input of op amp 28 can receive a DC voltage equal to the expected DC voltage of the square wave signal; in this example, voltage source 30 applies a voltage of one-half the peak-to-peak amplitude of the square wave stimulus signal, for example, one-half the supply voltage ($V_{pp}/2$). The output of op amp 28 can be coupled to terminal 42 of microcontroller 6, and thus to ADC 34 (via front end circuitry within microcontroller 6, not shown). Reference impedance 32 can be connected between the output and the inverting input of op amp 28, in a negative feedback manner. Reference impedance 32 can be, as examples, a precision resistor or variable impedance (e.g., a bank of precision resistors in combination with switches for selectably switching one or more of the resistors into the circuit), and thus can have a known impedance for purposes of this impedance measurement.

In measuring the impedance of DUT 4, the inverting amplifier arrangement of op amp 28 and reference impedance 32 can result in the negative feedback current conducted through reference impedance 32 being equal to the current conducted by DUT 4, under the ideal op amp assumption that the inverting input of op amp 28 is at a virtual ground and presents infinite input impedance. Measurement of the response voltage at terminal 42 can thus provide a measure of the current through reference impedance 32 because its impedance $Z_{REF}$ is known. Because the amplitude of square wave stimulus signal $V_{SQ}$ is also known (e.g., at supply voltage $V_{pp}$), the response voltage $V_{ADC}$ provides a measure of the impedance $Z_{DUT}$ of DUT 4. More specifically, an estimate $\hat{Z}_{DUT}(f)$ of the impedance of DUT 4 at frequency f can be determined by the architecture of FIG. 2 as:

$$\hat{Z}_{DUT}(f) \approx Z_{REF}\left(\frac{V_{SW}(f)}{V_{ADC}(f)}\right) - Z_{TX}$$

where $Z_{TX}$ is an estimate or measurement of the impedance of the anti-aliasing filter of a selected signal path, e.g., filter 18.

As mentioned above, calibration impedance 40 can be connected in parallel with DUT 4, in the signal path between anti-aliasing filters 16, 18 and op amp 28; load selection switches 24, 26 can operate to switch in either DUT 4 or calibration impedance 40, under the control of processor 36. Calibration impedance 40 may be realized as a resistor or other impedance element with a known impedance value $Z_{CAL}$, measured to the desired precision. It is also useful that calibration impedance 40 is of a known temperature coefficient. As suggested by FIG. 2, calibration impedance 40 may be a variable impedance, for example realized by multiple precision resistors of varying resistance values that may be selectably switched in and out of the circuit, to perform accurate calibration over a wide range of potential DUT impedances. Calibration impedance 40 can therefore provide a measurement of a known impedance to obtain a correction factor that can be stored in memory 38.

Calibration of the impedance analyzer of FIG. 2 can be performed by operating the circuit to measure the impedance of calibration impedance 40 at one or more frequencies, and comparing the measured impedance with the known impedance value $Z_{CAL}$. The manner in which calibration impedance 40 is measured will follow the same approach as described below in connection with FIG. 3 et seq. Differences between the measured impedance value $Z_{CAL}$ and the known impedance of calibration impedance 40 may arise because of non-idealities in op amp 28, variations in the transfer function of anti-aliasing filters 16, 18 from the ideal, inaccuracy in the impedance value of reference impedance 32, and parasitic impedances throughout the circuit, for example at the fixture in which DUT 4 will be inserted for measurement. These differences between the measured and known calibration impedance values $Z_{CAL}$ over the analyzed frequency ranges may then be used to adjust the corresponding impedance measurements obtained for DUT 4 at those frequencies.

Figure 3:
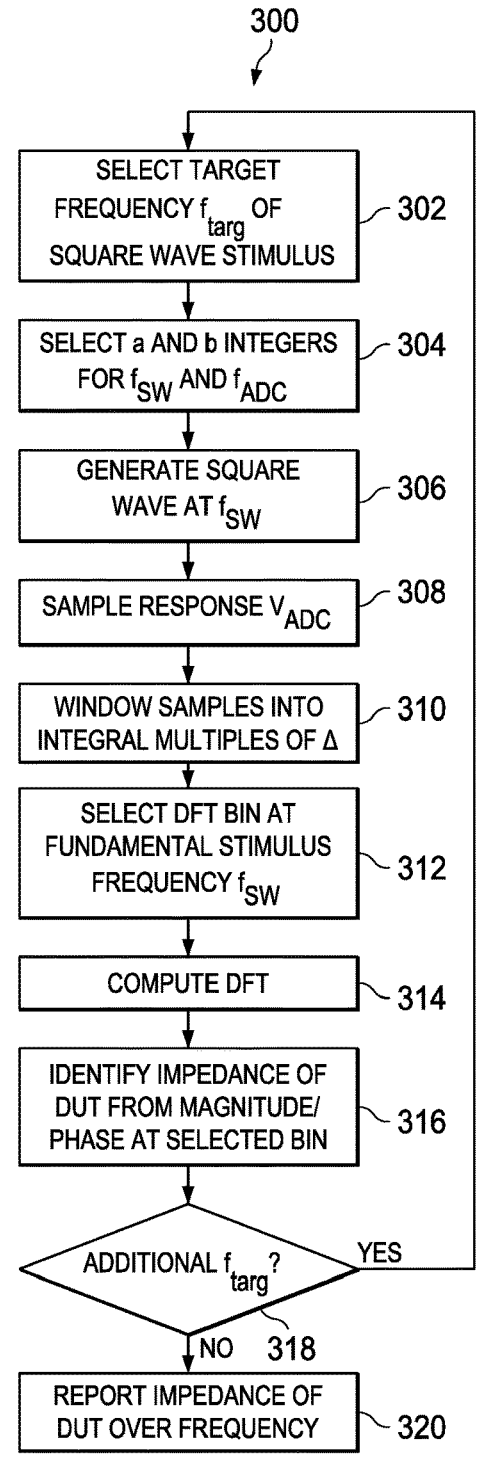
FIG. 3 is a flow chart showing an example method of impedance analysis.

In the method 300 illustrated in the flow chart of FIG. 3, the calibration adjustment values can have been previously determined over the desired frequency range and over the expected range of DUT impedances. When the method 300 of FIG. 3 begins, DUT 4 will have been inserted or otherwise connected into the system of FIG. 2, and load selection switches 24, 26 controlled to switch the fixture containing DUT 4 into the circuit and switch calibration impedance 40 out of the circuit.

A target frequency $f_{targ}$ at which measurement of the electrical impedance of DUT 4 is to be made is selected 302, for example in response to a user input communicated to microcontroller 6, or according to an instruction sequence being executed by processor 36 in which the desired target frequencies are established in advance. This target frequency $f_{targ}$ is the desired frequency $f_{SW}$ of the square wave stimulus $V_{SW}$ generated 306 by GPIO 10. In this example, stimulus frequency $f_{SW}$ can generated 306 by dividing down the frequency $f_{CLK}$ of base clock signal CLK by frequency divisor integer a, such that:

$$T_{SW} = a \cdot T_{CLK}$$

where $T_{SW}$ and $T_{CLK}$ are the periods of the stimulus frequency $f_{SW}$ and the base clock frequency $f_{CLK}$, respectively. Similarly, the sampling rate $f_{ADC}$ of ADC 34 is also divided down from the base clock frequency $f_{CLK}$, by frequency divisor integer b:

$$T_{ADC} = b \cdot T_{CLK}$$

where $T_{ADC}$ is the sampling period at ADC 34. Next, the frequency divisor integers a and b can be selected 304 to produce the desired square wave stimulus frequency $f_{SW}$ and desired sampling rate $f_{ADC}$ at a relationship that reduces interference from aliased harmonics with the fundamental frequency of the response of DUT 4 to that stimulus.

Figure 4:
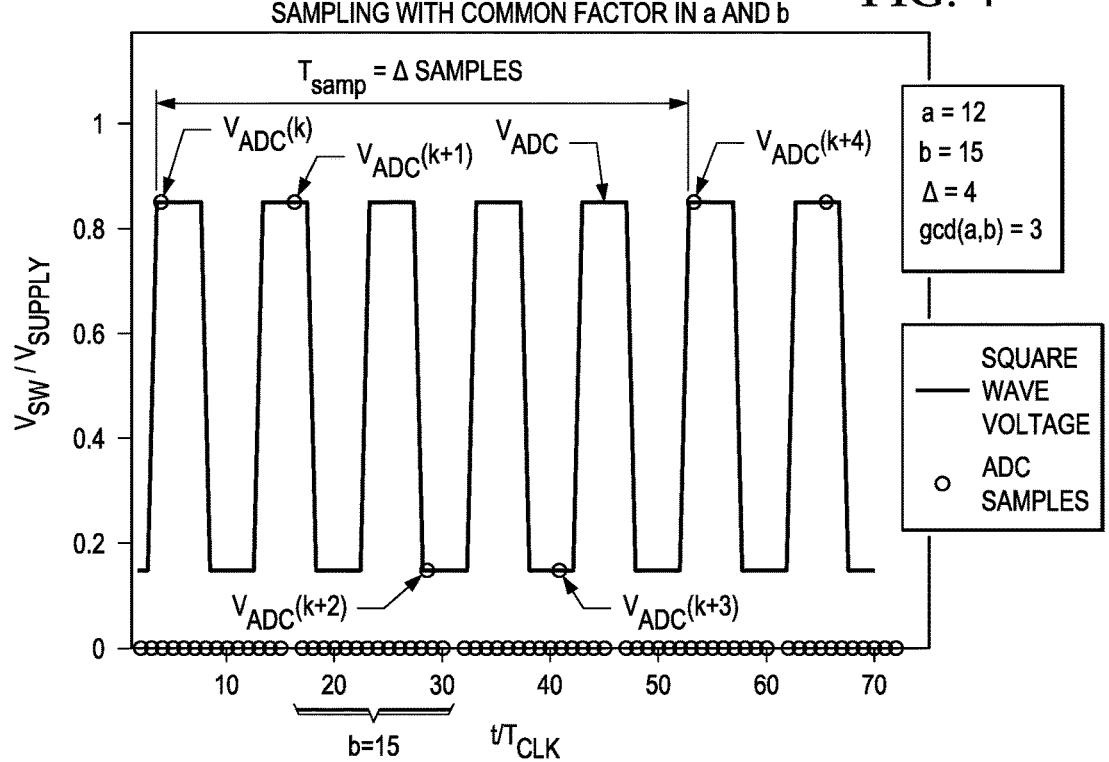
FIG. 4 is a plot showing an example of the relationship between frequency divisor integers used in the impedance analysis.

FIG. 4 illustrates a simplified example of the relationship between frequency divisor integers a and b relative to the timing of response waveform $V_{ADC}$ appearing at terminal 42, from op amp 28. Because the fundamental frequency of the response $V_{ADC}$ will not be shifted from that of stimulus $V_{SW}$, the period of the response waveform $V_{ADC}$ is equal to the period $T_{SW}$ of stimulus waveform $V_{SW}$ and the response $V_{ADC}$. In the example of FIG. 4, frequency divisor a has the value of twelve, and frequency divisor b has the value of fifteen. As such, the stimulus period $T_{SW}$ is twelve cycles of base clock signal CLK, and the sampling period $T_{ADC}$ is fifteen cycles of base clock signal CLK. In this example, a sample $V_{ADC}(k)$ is acquired by ADC 34 at a point in time coinciding with a rising edge of response waveform $V_{ADC}$, and the next three samples $V_{ADC}(k+1)$, $V_{ADC}(k+2)$, and $V_{ADC}(k+3)$ are acquired at points in time corresponding to different phases of response waveform $V_{ADC}$. In this example, the relationship of integers a and b (and thus the relationship between the stimulus period $T_{SW} = a \cdot T_{CLK}$ and the sampling period $T_{ADC} = b \cdot T_{CLK}$ results in the fourth sample $V_{ADC}(k+4)$ being acquired coincident with the rising edge of response waveform $V_{ADC}$. There can be derived a separation number $\Delta$ corresponding to the number of samples $V_{ADC}(n)$ acquired by ADC 34 at distinct phases of the response waveform $V_{ADC}$ as:

$$\Delta = \frac{a}{gcd(a, b)}$$

where gcd(a, b) is the greatest common divisor of integers a, b. In the example of FIG. 4, the greatest common divisor of a=12 and b=15 is gcd(a, b)=3. Accordingly, samples $V_{ADC}(n)$ are acquired at the same phase of response signal $V_{ADC}$ every $\Delta=4$ samples, which is represented in FIG. 4 as the period $T_{samp} = \Delta \cdot T_{ADC} = 4\, T_{ADC}$.

This separation number $\Delta$, which corresponds to the density of distinct phases of the stimulus waveform $V_{SW}$ that are sampled by ADC 34, provides an indication of the resolution of the measured response $V_{ADC}$. In an undersampled situation such as that shown in FIG. 4, and assuming that the sampled waveform is periodic and stable, one can reconstruct the waveform at high resolution by reordering samples acquired at different phases of the waveform over a number of cycles. In the case shown in FIG. 4, the separation $\Delta=4$ results in only distinct phases being sampled, regardless of the number of cycles. From the standpoint of resolution and precision, it is therefore useful for the separation number $\Delta$ to be as large as possible. Because the separation number $\Delta$ is inversely proportional to the greatest common divisor of frequency divisor integers a and b, the largest separation number $\Delta$ of samples for a given value of frequency divisor a will be obtained by selecting 304 integers a and b to be relatively prime.

Additional constraints due to limitations in the circuitry in microcontroller 6 may also be considered in selection 304 of frequency divisor integers a and b. One such constraint is the maximum sampling frequency of ADC 34. This maximum sampling frequency may be relatively low, especially for microcontroller-based implementations in which ADC 34 is relatively low performance to reduce device cost. Because measurement accuracy is improved at higher sampling rates, it is optimal for integer b to be selected so that the sampling frequency $f_{ADC}$ is as close to the maximum available frequency as possible. For example, if the frequency $f_{CLK}$ of clock signal CLK is 48 MHz and the maximum sampling frequency $f_{ADC}$ is 1 MHz, the value of frequency divisor integer b selected at 304 can be selected to be at least 48, and, for example, as near to 48 as possible to obtain the highest possible sampling resolution.

Processor 36 can operate to determine the impedance of DUT 4 by executing a discrete Fourier transform (DFT) on the sample stream of response voltage $V_{ADC}$ acquired by ADC 34. The DFT of a sample stream involves the "windowing" of the sample stream into a number of samples that are considered as the signal values within one period of a periodic sampled signal of infinite duration. While large numbers of samples within a DFT window are preferred, the available memory, computational capacity for the DFT operation, and time required to make a measurement typically constrain the maximum DFT window length.

The selection 304 of the frequency divisor integer values a and b can be important in reducing the interference from aliased harmonics with the fundamental frequency of the response voltage $V_{ADC}$. This can be accomplished by selecting frequency divisor integers a, b so that the number of samples N in a DFT window is an integer multiple of the separation number $\Delta$ of samples acquired at distinct phases of the response waveform acquired by ADC 34. Referring to FIG. 4, the period $T_{samp}$ of $\Delta$ samples can correspond to an integer number of cycles of the stimulus (and response) waveform. By selecting the window length N to be an integer multiple of the separation number $\Delta$ (i.e., N=q$\Delta$, for some integer q), and because a group of $\Delta$ samples itself represents an integer number of periods $T_{SW}$, the DFT window of length N can cover an integer number of periods $T_{SW}$. Lower order aliased harmonics of the fundamental frequency may tend to fall into different DFT bins from the fundamental DFT bin, which is the bin of importance for determining the impedance of DUT 4 for the purposes of the present example. Conversely, the strongest aliased harmonic affecting the fundamental frequency bin can be a higher order harmonic, for example, at a frequency that can be attenuated by, for example, anti-aliasing filter 18. In many cases, the effect of these higher order aliased harmonics on the DFT analysis of the impedance can be held below the white noise floor of the system, which allows ADC 34 to under-sample response voltage $V_{ADC}$.

The value of the separation number $\Delta$ of samples acquired by ADC 34 at distinct phases of the response waveform can affect the level of aliased harmonic noise on the response signal at the fundamental frequency. In a general sense, the interference resulting from these aliased harmonics appears as a set of equally spaced tones near the fundamental frequency. But it has been observed that odd-numbered values of the separation number $\Delta$ results in this interference appearing as a series of equally-spaced tones with alternating positive and negative amplitudes. Similarly, even-numbered values of the separation number $\Delta$ that are not divisible by four also results in interference in the form of a series of equally-spaced tones with alternating positive and negative amplitudes, but with a greater net amplitude than in the odd-valued $\Delta$ case. In contrast, values of the separation number $\Delta$ that are divisible by four result in the interference series having tones on the low side of the fundamental frequency that all have the same polarity amplitude (e.g., negative amplitude) and tones on the high side that all have the same polarity amplitude (e.g., positive amplitude), amounting to an overall higher level of aliased harmonic interference with the response signal at the fundamental frequency.

The signal-to-alias ratio for odd values of separation number $\Delta$ can be significantly higher (e.g., about 15 dB at $\Delta \approx 2000$) than even, not-divisible-by-four values, and higher yet (e.g., about 20 dB at 20 $\Delta \approx 2000$) than values that are divisible-by-four. Larger separation number $\Delta$ values provide improved signal-to-alias ratio performance.

The selection 304 of frequency divisor integers a, b can be performed subject to a set of constraints. First, frequency divisor a is selected as an integer value that establishes the fundamental 25 frequency $f_{SW} = f_{CLK}/a$ of the square wave stimulus $V_{SW}$ at or close to the target frequency $f_{targ}$ at which the impedance of DUT 4 is intended to be measured. Second, frequency divisor b is selected 304 as an integer value that establishes a sample rate $f_{ADC} = f_{CLK}/b$ that is below the maximum sample rate of ADC 34; for best resolution, frequency divisor b can be selected so that the sample rate $f_{ADC}$ is close to that maximum sample rate.

Third, frequency divisor integers a, b are selected 304 so that the separation number $\Delta = a/\gcd(a, b)$ is large, to reduce the interference from aliased harmonics in the fundamental frequency of the response $V_{ADC}$. In this regard, selection of integers a, b that are relatively prime will maximize the separation number $\Delta$ for a given value of frequency divisor a. For minimum harmonic interference at the fundamental frequency, it is desirable that the separation number $\Delta$ be odd-numbered if possible, or if not, even-numbered but not divisible by four. The selection of integers a, b to arrive at the separation number $\Delta$ is also constrained by the maximum window length (in samples) of the DFT implemented by processor 36, in combination with the constraint that the number of samples in the DFT window being an integer multiple of the separation number $\Delta$ ($N = q\Delta$). For values of frequency divisor a larger than the maximum window size, frequency divisor integers a, b will not be relatively prime. In any case, it is desirable for the separation number $\Delta$ to be as large as possible while meeting the DFT window requirement of $N = q\Delta$.

In addition to the selection 304 of frequency divisor integers a, b to meet these constraints and desired properties, selection 304 may include or be based on simulation or measurement of tone-to-interference ratios at candidate values of integers a, b, with the final selection of those frequency divisor values made based on a comparison of their signal-to-alias performance. In this context, anti-aliasing filters 16, 18 may be modeled to have the desired or expected characteristics, for example modeled as a cascade of identical single-pole stages with selected cutoff frequencies.

The selection 304 of frequency divisor integers a, b can be carried out by way of conventional integer linear programming routines and the like, either performed by processor 36 "on-the-fly" in response to the selection of a target frequency for the impedance measurement, or performed off-line to provide pre-programmed program instructions stored in memory 38 for execution by processor 36 or other logic in microcontroller 6. Alternatively, a user may input the values of frequency divisor integers a, b, for example by storing configuration information or program code in memory 38 of microcontroller.

Frequency divisor selection 304 is completed by processor 36 or other appropriate logic circuitry in microcontroller 6 setting digital timers 46, 48 with the appropriate configuration values or data corresponding to the selected frequency divisor integers a, b, respectively. In the case of digital timers 46, both a frequency (i.e., integer a) and a duty cycle (nominally 50%) for the desired stimulus waveform $V_{SW}$ may be set. Measurement of the impedance of DUT 4 at the selected stimulus frequency $f_{SW}$ may then begin.

Microcontroller 6 can generate 306 the square wave stimulus signal $V_{SW}$ for application to DUT 4. In the architecture of FIG. 2 described above, GPIO 10 can produce square wave stimulus signal $V_{SW}$ by driving terminals 44 at high and low voltages at the frequency and duty cycle configured into digital timers 46 during selection 304. These voltage levels can be at the rail voltages (e.g., supply voltage $V_{pp}$ and ground, respectively), or at other digital logic levels if desired. Stimulus voltage $V_{ADC}$ can be filtered by anti-aliasing filters 16, 18 and applied to DUT 4, which has been switched into the measurement loop by load selection switches 24, 26. As described above, the inverting amplifier arrangement of op amp 28, reference impedance 32, and voltage source 30 present a response voltage $V_{ADC}$ at terminal 42, for receipt and processing by microcontroller 6.

ADC 34 can sample 308 the response voltage $V_{ADC}$ received at terminal 42 (after buffering and filtering by conventional analog circuitry within microcontroller 6), at the sampling frequency $f_{ADC}$ corresponding to the base clock frequency $f_{CLK}$ divided by the frequency divisor integer b selected 304. The resulting sample stream can be forwarded to processor 36 for DFT analysis of the response of DUT 4 at the fundamental frequency. In carrying out that DFT analysis, the sample stream of the response is windowed 310, with the number of samples in the DFT window being an integral multiple of the separation number $\Delta$. As described above, the separation number $\Delta$ corresponds to the stimulus frequency divisor integer a divided by the greatest common divisor of frequency divisor integers a, b.

Before or after bin selection 312, DFT algorithm can be executed 314 by processor 36 on the sample window previously acquired 310. Any one of a number of conventional discrete Fourier transform approaches may be carried out 314 by processor 36, examples of such DFT techniques including fast Fourier transform (FFT) algorithms. As discussed above, because the stimulus and sampling frequencies are both based on the same high-speed clock signal CLK, and because of the selection of the frequency divisor integers a, b that determine those frequencies and the arrangement of the DFT window as an integer multiple of the separation number Δ based on those integers, lower order aliased harmonics of the fundamental frequency fall into different DFT bins from that of the fundamental frequency itself.

Lower order harmonics such as the third, fifth, and seventh harmonics clearly fall in different FFT bins from that of the fundamental tone (i.e., that associated with square wave stimulus frequency $f_{SW}$=100 kHz), and as such do not interfere with the observed response at the stimulus frequency. As described above, this placement of these lower order harmonics into DFT bins other than the fundamental tone bin results from the DFT window having a size that is an integer multiple of the separation number Δ. Higher orders of aliased harmonics will eventually appear in the DFT bin corresponding to the fundamental square wave stimulus frequency $f_{SW}$. Selection of a sufficiently large value of separation number Δ results in these contaminating harmonics being at high enough frequency (e.g., above the 400th harmonic) as to have been attenuated by anti-aliasing filter 18. In many cases, the contribution of those harmonics falling within the selected DFT bin for the fundamental frequency will be below the white noise floor of the system, and thus insignificant.

For purposes of the measurement of the impedance of DUT 4, it can be assumed that DUT 4 does not apply a frequency shift to the stimulus waveform, so that only the stimulus frequency $f_{SW}$ is of interest in determining impedance. This bin for the fundamental frequency may be identified as:

$$\text{bin} = N \text{mod}\left(\frac{f_{SW}}{f_{ADC}}, 1\right) = N \text{mod}\left(\frac{b}{a}, 1\right)$$

Accordingly, the DFT bin corresponding to the fundamental stimulus frequency $f_{SW}$ is selected for analysis 314, for example after the completion of an FFT or similar algorithm on the windowed samples of the response waveform $V_{ADC}$.

Further efficiencies can be gained because only the DFT bin pertaining to the fundamental stimulus frequency $f_{SW}$ is of interest. For example, the desired DFT bin can be selected 312 prior to executing the DFT algorithm 314, as shown in FIG. 3. This allows use of the Goertzl algorithm to compute the DFT result for the bin selected 312, without requiring the computation of the response for all of the other DFT bins and thus saving computational time and improving overall system performance. Examples of algorithms based on the Goertzl algorithm are described in Mock, "Add DTMF Generation and Decoding to DSP-uP Designs," Application Report SPRA168 (Texas Instruments Incorporated, 1989), and Chen, "Modified Goertzl Algorithm in DTMF Detection Using the TMS 320C80," Application Report SPRA066 (Texas Instruments Incorporated, 1996), both herein incorporated by reference. Significant efficiency in the computational effort required in DFT 314 due to significant reduction in the number of operations required, as compared with conventional FFT-type algorithms, can be attained according to this approach.

Processor 36 can determine 316 the impedance of DUT 4 from the results of DFT 314 for the fundamental frequency bin selected 312. The computations 316 can be performed in the complex domain, so that both the magnitude and phase components of the DFT can be determined in DFT computation 314. In general, as discussed above, an impedance estimate $\hat{Z}_{DUT}(f_k)$ for DUT 4 at a given frequency $f_k$ (where k indicates the DFT bin selected 314) can be expressed as:

$$\hat{Z}_{DUT}(f_k) \approx Z_{REF}\left(\frac{V_{SW}(f_k)}{V_{ADC}(f_k)}\right) - Z_{TX}$$

where $Z_{TX}$ is an estimate of the impedance of anti-aliasing filter 18. Given the above, an appropriate instruction sequence can be derived for execution by processor 36 to evaluate this impedance estimate $\hat{Z}_{DUT}(f_k)$ in the complex domain. The square wave stimulus $V_{SW}$ at frequency $f_{SW}$ and reference impedance $Z_{REF}$ being known quantities, the impedance $Z_{TX}$ of a selected anti-aliasing filter (e.g., anti-aliasing filter 18) can be estimated from the calibration process described above (and can include contributions of parasitic impedances and other non-idealities in the circuit). In identification 316, processor 36 can apply the amplitude and phase results from the DFT computed in 314 on the sampled response $V_{ADC}$, in the DFT bin for the fundamental stimulus and response frequency selected in 316, to this relationship to determine an impedance estimate $\hat{Z}_{DUT}(f_k)$ for DUT 4 at that frequency $f_k$. Adjustments to this impedance estimate $\hat{Z}_{DUT}(f_k)$ that were determined by measuring calibration impedance 40 in the calibration process described above may be applied to the results of these calculations in 316.

As mentioned above, measurement of the impedance of DUT 4 can be performed over a range of stimulus frequencies $f_{SW}$, for example from DC to a high frequency limit, which frequency limit may be a function of the capabilities of clock 8 in microcontroller 6. According to the method 300 of FIG. 3, decision 318 can be executed to determine whether the impedance of DUT 4 is to be evaluated at additional target frequencies $f_{targ}$. If so (i.e., if decision 318 is "yes"), the next target frequency $f_{targ}$ can be selected 302, and the method 300 can repeat to carry out the impedance measurement at that next frequency.

Upon the impedance of DUT 4 being measured at all target frequencies $f_{targ}$ of interest (i.e., if decision 318 is "no"), DUT 4 may be removed from the test fixture. The results of the impedance measurement for this instance of DUT 4 can then be reported 320 in the desired manner, whether by communicating data corresponding to the measurement results, both magnitude and phase, that were obtained over the range of target frequencies $f_{targ}$ to another computer or data processing system, or by microcontroller 6 itself applying an analysis routine to carry out some or all of the appropriate operations to provide a final result.

The above description outlines the functioning of analyzer 201 when on-chip clock 8 is capable of generating a square wave stimulus signal of sufficiently high frequency such that, when divided down by integer divider(s) in digital timers 46, the stimulus signal $V_{SW}$ (provided, e.g., from pin 44) is capable of providing an analysis of the impedance of DUT 4 at the desired highest stimulus frequency. However, in some instances, on-chip clock 8 may not be able to provide high enough frequencies to cover the entire desired range of stimulus frequencies, as explained below. In these cases, analyzer 201 can make use of parallel stimulus signal paths between microcontroller 6 and DUT 4 to provide analysis at higher frequencies than could be performed by microcontroller 6 alone.

As noted previously, base clock signal CLK provided from on-chip clock 8 can be applied to digital timers 46 associated with GPIO 10, which can divide down the frequency $f_{CLK}$ by a first integer divisor (a) to derive the timing of square wave stimulus signals. Also as noted previously, digital timer 48 can apply a second integer divisor (b) to base signal CLK to adjust the sampling frequency of the ADC 34 to minimize the distortion present in impedance estimates or determinations because of the fact that a square wave stimulus signal is used, rather than a sine wave stimulus signal. When the first integer divisor is ten or greater, the technique of changing sample frequency of ADC 34 suffices to minimize the distortion. However, absent parallel signal paths as described below, performance of analyzer 201 can suffer when the first integer divisor is less than ten. Resultantly, the highest frequency that can be generated by on-chip clock 8 (i.e., before the division of digital timers 46) determines the maximum stimulus signal frequency.

Thus, where, for example, the maximum frequency that can be generated by on-chip clock 8 is 24 MHz, the maximum stimulus frequency that can be generated by GPIO 10 is in practice only about 2.4 MHz. Where, for example, the maximum frequency that can be generated by on-chip clock 8 is 48 MHz, the maximum stimulus frequency that can be generated by GPIO 10 is in practice only about 4.8 MHz.

Analyzer 201 can achieve higher stimulus frequencies without distortion-based performance degradation by providing clock synthesizer 12 that can include an off-chip PLL to multiply up a clock frequency prior to going through a divider to produce the final square wave stimulus signal $V_{SW}$. Analyzer 201 can provide parallel stimulus signal paths between microcontroller 6 and DUT 4 for different stimulus signal frequency ranges.

One or more terminals of microcontroller 6, such as terminal 45, can be driven by GPIO 10 to provide a stimulus signal to off-chip clock synthesizer 12 in a stimulus signal path. Off-chip clock synthesizer 12 can provide high-frequency clock signals that can enable impedance analyzer 201 to analyze impedances at frequencies limited only by the capabilities of the clock synthesizer 12. For example, stimulus frequencies of greater than about 200 kHz and up to about 20 MHz can be provided by a signal path that includes clock synthesizer 12. Although the functionality of clock synthesizer 12 can be integrated into microcontroller 6, providing clock synthesizer 12 off-chip (i.e., separate from microcontroller 6) can result in lower system cost. Clock synthesizer 12 can include, for example, a phase-locked loop (PLL) and a divider circuit to provide the desired stimulus frequencies relatively higher than those that could be provided by microcontroller 6 alone. An example of a clock synthesizer device that may be suitable for implementation as clock synthesizer 12 is the CDCE913 programmable 1-PLL VCXO clock synthesizer available from Texas Instruments Incorporated.

Figure 5:
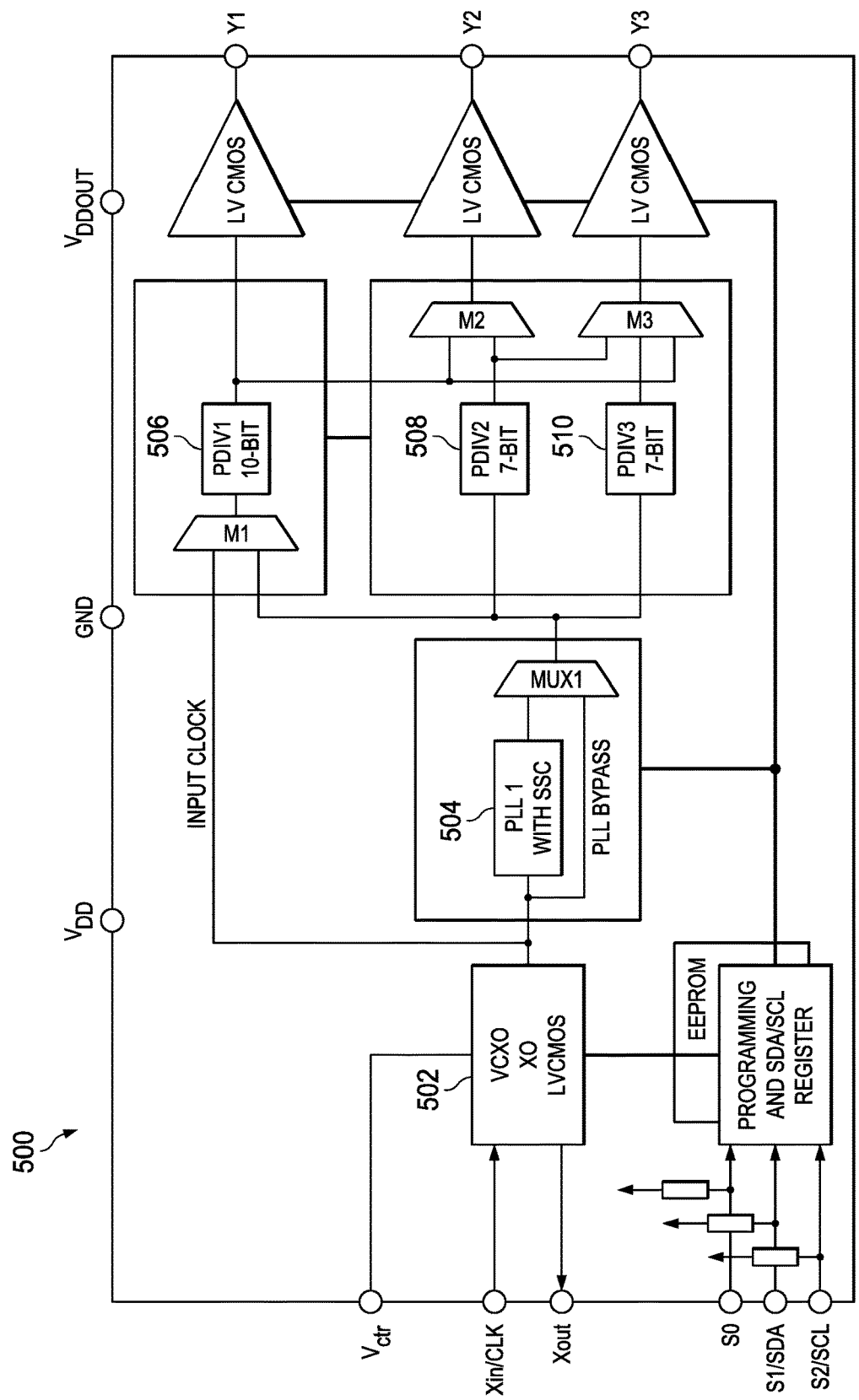
FIG. 5 is a block diagram of an example clock synthesizer.

FIG. 5 is a block diagram of an example clock synthesizer 500, which can correspond to clock synthesizer 12 of FIG. 2, and which can change the input clock frequency provided by GPIO 10 by multiplying the input frequency by an integer and then dividing by another integer to get an output clock frequency. The Xout terminal can be grounded while the Xin/CLK terminal can receive a clock signal from GPIO 10 of microcontroller 6. Input circuit 502 can select the input type, e.g., LVCMOS for a non-differential, single-ended input on the Xin/CLK terminal. PLL1 504 can be, for example, a fractional PLL with a 12-bit multiplier (1-4095) and a 9-bit divider (1-511), while dividers Pdiv1 506, Pdiv2 508, and Pdiv3 510 can provide 10-bit, 7-bit, and 7-bit division, respectively. As an example, clock synthesizer 500 can first multiply an about 24 MHz clock from GPIO 10 up to about 200 MHz in PLL1 504, then go through the 10-bit divider of Pdiv1 506 to yield an output frequency of anywhere between about 20 MHz all the way down to about 200 kHz. The frequency of the output stimulus signal generated clock synthesizer 500 can be programmatically controlled, for example, by processor 36, via control inputs S0/S1/S2. The newly generated high-frequency clock signal can be output, for example, on terminal Y2 of clock synthesizer 500. In some examples, the square wave signal provided to the clock synthesizer 12 will be of the highest frequency generable by GPIO 10.

Thus, although a 20 MHz stimulus signal can be applied to DUT, it appears from the perspective of microcontroller 6 as if the process began with an effective clock frequency of about 200 MHz, even if clock generator 8 is only capable of generating frequencies up to about 24 MHz or 48 MHz. Because the generated square wave stimulus signal is phase-locked, performance will not be impacted by distortion in the same way as if CLK was divided by an integer less than ten in digital timers 46.

The high-frequency signal path can further include a ½ cycle delay 14 to insure that samples taken by ADC 34 are shifted from the rising and falling edges of the generated square wave. If ADC samples are taken on rising edge of square wave, a small amount of timing jitter can result in a large error in ADC samples. Shifting the high-frequency stimulus signal by ½ cycle can prevent ADC 34 from sampling on a rising edge. The ½ cycle delay 14 can comprise, for example, a high-speed flip-flop and an inverter, and can use a retiming technique, taking an auxiliary clock from clock synth 12, as shown in FIG. 2. Alternatively, ½ cycle delay 14 can omit use of auxiliary clock line, and can comprise, for example, a string of buffers to add a fixed delay that is known to be sufficient to avoid the collision between the sample time and the rising-edge time.

Thus, the described analyzer 201 can provide parallel stimulus signal paths. For example, a primary path for low stimulus frequencies (e.g., DC to 200 kHz) can use a square wave stimulus signal generated directly from GPIO 10, while a high-frequency secondary path can include clock synthesizer 12 to generate higher stimulus signal frequencies (e.g., 200 kHz to 20 MHz). Although only two paths are illustrated in FIG. 2, analyzer 201 can include any number of parallel signal paths to accommodate any number of distinct stimulus signal frequency ranges or other stimulus signal characteristics. A particular signal path from among the plurality of parallel paths can be chosen with path selection switch 20, which can be provided, for example, as a switching multiplexor that can be controlled by processor 36 in microcontroller 6 or by another component of the analyzer 201. Each of the parallel stimulus signal paths can provide a stimulus of a different characteristic, e.g., each path can be used for stimulus square wave signals of different frequency ranges.

Because, in the illustrated example, a plurality of parallel stimulus signal paths provided between microcontroller 6 and DUT 4 can each carry stimulus signals of different frequency ranges, the anti-aliasing filters 16, 18 associated with each path may have different frequency cutoffs or other filter characteristics. For example, anti-aliasing filter 16 on a signal path intended to carry stimulus signals between 200 kHz and 20 MHz may be a 20 MHz low pass filter (i.e., with a cut-off frequency of about 20 MHz), whereas anti-aliasing filter 18 on a different signal path may be a 300 kHz low-pass filter (i.e., with a cut-off frequency of about 300 kHz). In some examples, a second-order low-pass filter can be used for the low-frequency path, while a fourth-order low-pass filter can be used for the high-frequency path.

Figure 6:
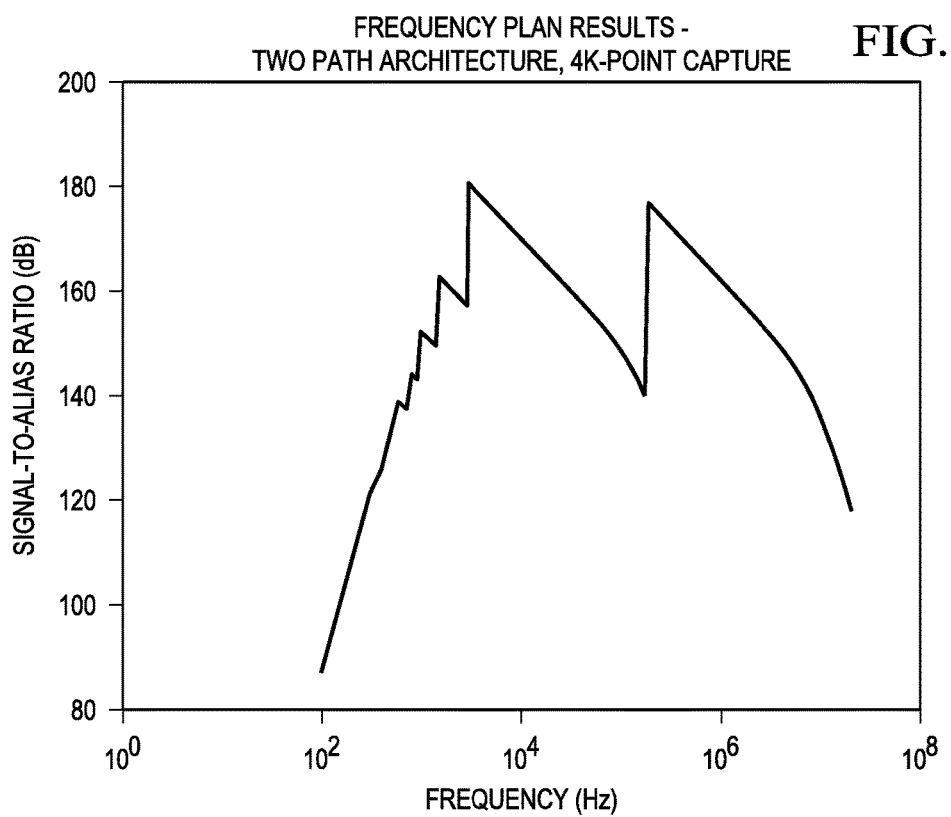
FIG. 6 is an example frequency plot of signal-to-alias ratio for an example impedance analyzer.

The two-path architecture illustrated in FIG. 2 further permits for the capture size, defined as the number of samples taken at each frequency to be measured by analyzer 201, to be reduced to about 4,000 samples for both signal paths, and permits the capture time per frequency bin to be reduced to about 4 milliseconds. FIG. 6 shows a plot of the signal-to-alias ratio (SAR), in decibels, of the analyzer of FIG. 2 versus frequency for a 4,000 point capture. The plot shows, for example, that better than 120 dB SAR can be obtained for most stimulus frequencies. Reduction in SAR at low frequencies can result from a phase-change of anti-aliasing filter 16 causing constructive interference between the aliases falling on the target frequency.

The analyzer 201 can further reduce scan time by analyzing impedance for multiple stimulus-signal fundamental frequencies simultaneously, and/or by generating impedance estimates at frequencies other than the fundamental frequency of each one or more square-wave stimulus signals. When processor 36 generates impedance estimates only at the fundamental frequency of a single stimulus signal, the capture time per stimulus frequency can exceed the processing time needed to compute the impedance at each stimulus frequency, including correction for calibration. However, some examples of the analyzer 201 can make use of simultaneous multi-frequency analysis.

Figure 7:
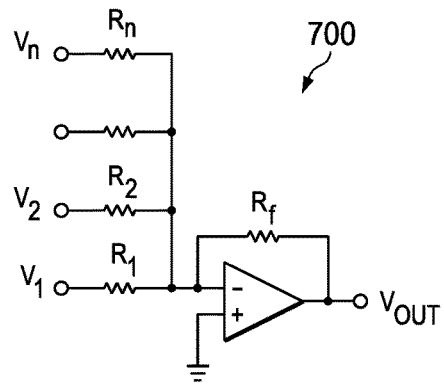
FIG. 7 is an example summation circuit.

As one example of simultaneous multi-frequency analysis, microcontroller 6 can include multiple GPIOs 10 to produce multiple square wave stimulus signals, having different divide ratios, at multiple frequencies simultaneously. The simultaneous multiple stimulus signals can be provided on multiple GPIO output terminals of microcontroller 6 and can be summed, for example, using an off-chip summation circuit, such as the one illustrated in FIG. 7, which can be included prior to anti-aliasing filter 18 to combine the simultaneous multiple stimulus signals. For example, each of $V_1$, $V_2$, ... $V_n$ in the summation circuit of FIG. 7 can be connected to a different GPIO output terminal to generate a summed signal on $V_{out}$. So long as the total duration of data captured is exactly a number of whole periods for every stimulus frequency, there will be no interference between the multiple stimulus signals when the DFT is computed, because energy from the different frequency stimulus signals will fall into different bins of the DFT. Thus, the impedance at the multiple fundamental frequencies can be computed (e.g., in processor 36) by reprocessing captured sample data for each of the several different fundamental frequencies, and analysis time can be saved by measuring the DUT 4 at different frequencies simultaneously.

Alternatively or in addition, the frequency response of square wave signals can be used to reduce the sweep time by reprocessing captured sample data to obtain impedance estimates at odd harmonics of a known duty cycle square wave stimulus. For a single square wave, impedance can be computed at each of the third, fifth, seventh, etc. harmonic of the fundamental frequency by re-processing collected sample data. Time savings can be realized because the discrete Fourier transform at a different frequency can be computed faster than the data capture for a new square wave. For a fixed pair of frequency divisor integers a, b as defined previously, the target bin DFT bin for computation of the impedance at the frequency of the kth harmonic is given by $$bin_k = N\text{mod}\left(\frac{kf_{SW}}{f_{ADC}}, 1\right) = N\text{mod}\left(\frac{kb}{a}, 1\right).$$

The computation of the impedance at the harmonic frequency can use a process similar to that illustrated in FIG. 3, where the bin identified for the fundamental frequency of the square wave in 312 is replaced by the bin corresponding to the bin of the kth harmonic of the square wave.

Figure 8:
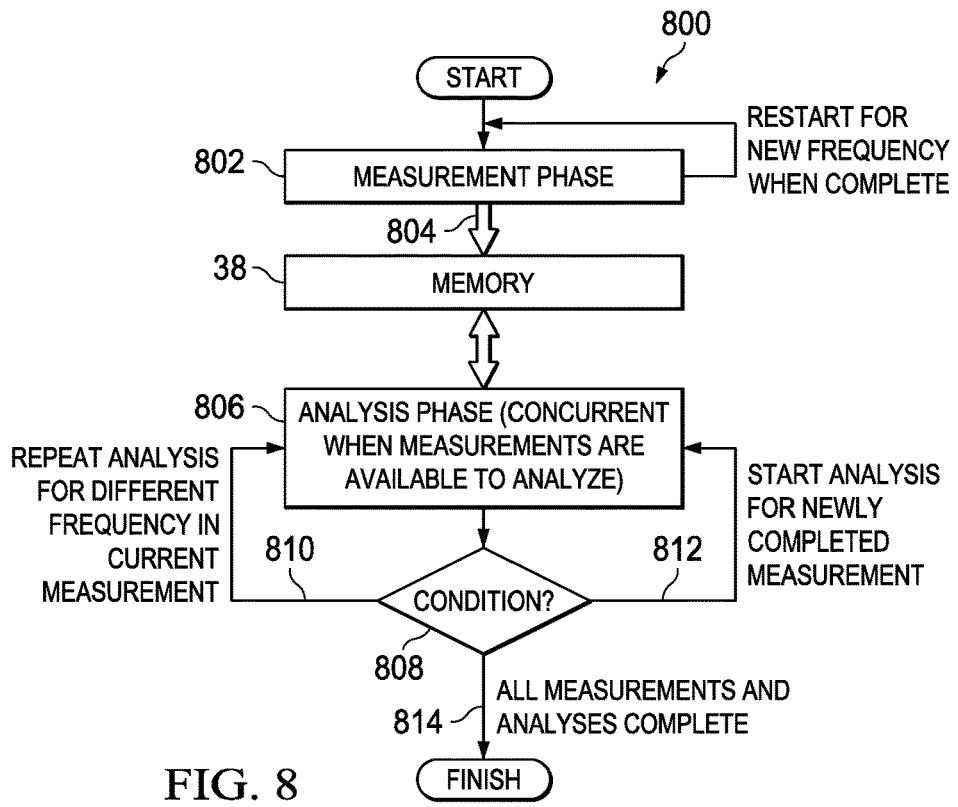
FIG. 8 is a flow chart showing another example method of impedance analysis.

In accordance with the above, a simultaneous multi-frequency analysis can be performed according to the flow chart of FIG. 3, as summarized in the flow chart 800 of FIG. 8. An initial measurement phase 802 comprising frequency selection 302, divisor integer selection 304, stimulus signal generation 306, and response sampling 308 can be performed for an initial target frequency, or set of summed initial target frequencies, to generate an initial data set for processing. The data set can be stored 804 in memory 38. While processor 36 performs an analysis phase 806 on the stored initial data set, consisting of windowing 310, bin selection 312, DFT computation 314, and impedance identification from selected bin (including calibration factor correction) 316, for an initial target frequency, a subsequent measurement phase 802 can be initiated for a subsequent target frequency (or summed frequencies). The subsequent target frequency (or frequencies) can be selected, for example, to be different than any previously measured target frequency. The subsequent target frequency (or frequencies) can also, for example, be selected to be different than any of the odd harmonics of any previously measured target frequency.

During the time that the analyzer 201 completes the subsequent measurement phase 802, the processor 36 can repeat 810 the analysis phase 806, either for additional target frequencies already measured, or for odd harmonics of an already-measured target frequency, by, for example, repeating bin selection 312, possibly also repeating DFT computation 314, and repeating impedance identification 316 for a DFT bin corresponding to an odd harmonic. This repetition 810 can continue until a condition 808 is met, whereupon the analysis can proceed for a new set of measurement data or the process can terminate if all frequencies of interest have been analyzed.

In general, condition 808 is indicative of whether it would be more profitable to begin analyzing newly collected measurement data, or terminate all analysis, than to continue to analyze older measurement data. In some examples, this repetition 810 can continue until all of the summed multiple target frequencies have been analyzed and/or all useful odd harmonics have been analyzed. In other examples, this repetition 810 can continue until the subsequent measurement phase has completed. Whatever the condition 808, processor 36 can begin 812 to analyze newly stored data from the subsequent measurement phase, while simultaneously, another subsequent measurement phase 802 at a not-yet-measured target frequency can be initiated. The simultaneous analysis 806 and measurement 802 can be repeated for all frequencies of interest, whereupon the process can terminate 814. By decoupling analysis 802 from measurement 806, and by performing multiple analyses 806 at different frequencies during each measurement 802, the time required for impedance analysis over the range of desired frequencies can be reduced.

Figure 9:
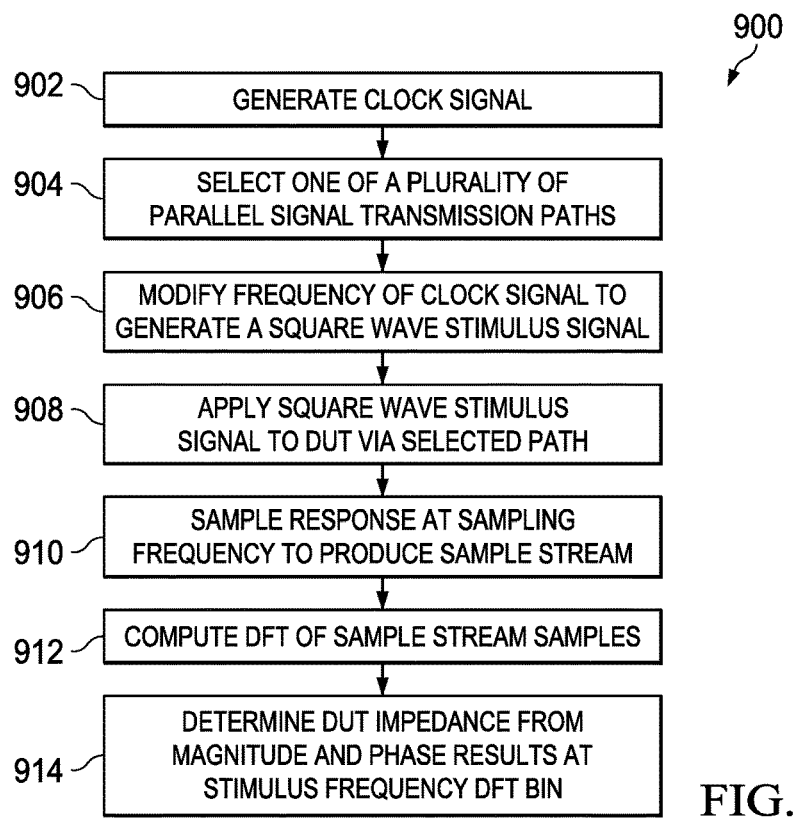
FIG. 9 is a flow chart showing still another example method of impedance analysis.

FIG. 9 is a flow chart illustrating a method 900 of measuring an impedance of a DUT. The method can use, for example, the analyzer, 201, of FIG. 2. The method can begin with generating 902 a clock signal at a frequency, which can be done, for example, programmatically by the processor 36 of the microcontroller 6 in FIG. 2. The method can continue with selecting 904 one of a plurality of parallel signal transmission paths between the microcontroller and the DUT. The selection can occur, for example, by adjusting a switch connecting the selected path to the DUT, such as switch 20 in FIG. 2. The selected stimulus signal transmission path can include, separate from the microcontroller, a fractional phase-locked loop (PLL) and an integer divider circuit, as may be included, for example, in clock synthesizer 12 of FIG. 2 (e.g., 504 and 506 of FIG. 5).

The impedance analysis method 900 of FIG. 9 can continue by modifying the frequency of the clock signal to generate a square wave stimulus signal at a stimulus frequency. This frequency modification can be done, for example, with the PLL 504 and divider 506 circuit 500. Next, the square wave stimulus signal can be applied 908 to the DUT via the selected path, and a response signal corresponding to the response of the DUT to the square wave stimulus signal can be sampled 910 at a sampling frequency to produce a sample stream. The DFT of samples of the sample stream can be computed 912. Then, the impedance of the DUT can be determined 914 from a magnitude and phase result of the DFT at a selected bin corresponding to the stimulus frequency. The impedance of the DUT can also be determined from a magnitude and phase result of the DFT at a selected bin corresponding to an odd harmonic of the stimulus frequency, as described previously.

As described herein, a low-cost implementation of an impedance analyzer can be attained. More specifically, the description allows a digital output from an integrated circuit, such as a GPIO function in a microcontroller, to generate the stimulus for the measurement of an impedance over a range of frequencies, thus eliminating the need for costly and area-intensive circuits such as on-chip fractional PLLs and high-precision DACs on-chip to generate sinusoids. These examples allow relatively low performance analog-to-digital converters (ADCs) to sample the impedance response, for example, under-sampling the response at higher stimulus frequencies, without resulting in significant interference from aliased harmonics. The examples herein provide not only lower cost, but also expanded analysis bandwidth and improved analysis speed. Impedance analyzer functions according to these examples can be deployed into a wide range of applications that would have been cost-prohibitive using conventional circuitry.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. An impedance analyzer to analyze the impedance of a device under test (DUT) over a range of frequencies, the impedance analyzer comprising:
  a microcontroller to generate a first square wave signal at a first frequency;
  parallel signal transmission paths between the microcontroller and the DUT, each parallel path to transmit one of the first square wave signal or a square wave signal based on the first square wave signal, the parallel paths comprising:
    a first path comprising a first anti-aliasing filter for filtering the first square wave signal to remove frequencies higher than a first filter frequency, the first path to deliver the first square wave signal to the DUT; and
    a second path comprising a clock synthesizer integrated circuit (IC), separate from the microcontroller, to generate a second square wave signal, based on the first square wave signal, at a second frequency, the second path further comprising a second anti-aliasing filter for filtering the second square wave signal to remove second frequencies higher than a second filter frequency, the second filter frequency being higher than the first filter frequency; and
  a path selection switch controllable by the microcontroller to select one of the parallel paths.

2. The impedance analyzer of claim 1, wherein the second path further comprises circuitry to delay the second square wave signal by about one half cycle.

3. The impedance analyzer of claim 1, wherein the first anti-aliasing filter is a second-order low-pass filter and the second anti-aliasing filter is a fourth-order low-pass filter.

4. The impedance analyzer of claim 1, wherein the microcontroller does not include digital frequency synthesis circuitry and digital-to-analog converter circuitry (DAC) for generating an analog sinusoidal wave to use as an impedance analysis stimulus signal.

5. The impedance analyzer of claim 1, wherein the clock synthesizer IC comprises a fractional phase-locked loop (PLL) and at least one divider.

6. The impedance analyzer of claim 1, wherein the microcontroller comprises a plurality of general-purpose input/output (GPIO) components and corresponding GPIO terminals for outputting square wave signals of different frequencies, and wherein the impedance analyzer further comprises a summation circuit between the GPIO terminals and the DUT to sum the square wave signals output from the GPIO terminals into a single stimulus signal.

7. The impedance analyzer of claim 1, wherein the microcontroller comprises an analog-to-digital converter (ADC) to sample a measurement signal based on the second square wave signal delivered to the DUT, and wherein the second path further comprises circuitry to delay the second square wave signal so that the ADC does not sample from rising edges of the measurement signal.

8. The impedance analyzer of claim 1, wherein the microcontroller is programmed to calculate the impedance of the DUT responsive to a magnitude and phase result of a discrete Fourier transform (DFT) at a selected DFT bin corresponding to an odd harmonic of the stimulus frequency.

9. A method of measuring an impedance of a device under test (DUT), comprising:
  generating a clock signal at a frequency;
  selecting one of a plurality of parallel signal transmission paths between a microcontroller and the DUT by adjusting a switch connecting the selected path to the DUT, the selected stimulus signal transmission path comprising, separate from the microcontroller, a fractional phase-locked loop (PLL) and an integer divider circuit;
  modifying, with the PLL and divider circuit, the frequency of the clock signal to generate a square wave stimulus signal at a first stimulus frequency;

applying the square wave stimulus signal to the DUT via the selected path;

sampling a response signal corresponding to the response of the DUT to the square wave stimulus signal, at a sampling frequency to produce a sample stream;

computing a discrete Fourier transform (DFT) of samples of the sample stream; and determining the impedance of the DUT from a magnitude and phase result of the DFT at a selected bin corresponding to the first stimulus frequency.

10. The method of claim 9, wherein the selecting one of the plurality of parallel signal transmission paths is performed programmatically by the microcontroller.

11. The method of claim 9, further comprising determining the impedance of the DUT from a magnitude and phase result of the DFT at a selected bin corresponding to an odd harmonic of the stimulus frequency.

12. The method of claim 9, further comprising delaying the square wave stimulus signal by one half cycle.

13. The method of claim 9, further comprising anti-alias-filtering the square wave stimulus signal to remove frequencies higher than a filter frequency.

14. The method of claim 9, further comprising, subsequent to the sampling:

changing the frequency of the clock signal;

modifying the frequency of the clock signal by dividing the frequency of the clock signal by an integer divisor to generate a new square wave stimulus signal at a second stimulus frequency;

selecting another of the plurality of parallel paths by adjusting the switch, the newly selected path not comprising a PLL;

applying, to the DUT, the new square wave stimulus signal via the newly selected path;

sampling a new response signal corresponding to the response of the DUT to the new square wave stimulus signal, at a new sampling frequency to produce a new sample stream;

computing a discrete Fourier transform (DFT) of samples of the new sample stream; and determining the impedance of the DUT from a magnitude and phase result of the DFT at a selected bin corresponding to the second stimulus frequency.

15. The method of claim 9, further comprising determining the impedance of the DUT from a magnitude and phase result of a DFT at a selected DFT bin corresponding to an odd harmonic of the first stimulus frequency.

16. The method of claim 9, comprising:

generating, simultaneously, a plurality of square wave signals at a plurality of different stimulus frequencies;

summing the plurality of square wave signals using a summation circuit to generate the square wave stimulus applied to the DUT;

wherein the impedance of the DUT is further determined from magnitude and phase results of the DFT at selected bins corresponding to the plurality of different stimulus frequencies; and wherein the sampling of the response signal is performed over a data capture duration equal to a number of whole periods for each of the stimulus frequencies.

17. A method of impedance analysis of a device under test (DUT) comprising:

completing an initial measurement phase comprising:
selecting a first target frequency,
generating a square wave stimulus signal at the first target frequency,
delivering the stimulus signal to the DUT, and
sampling a response signal from the DUT to generate an initial measurement data set;

performing, with a processor, an analysis phase on the initial measurement data set, comprising:
windowing the measurement data set,
computing a discrete Fourier transform (DFT) of the windowed data,
selecting a bin of the computed DFT corresponding to the first target frequency, and
identifying the impedance of the DUT at the first target frequency based on the computed selected bin;

repeating at least the bin selection and impedance identification of the analysis phase for a second analysis frequency that is an odd harmonic of the first target frequency, the repeated analysis phase being based on the initial measurement data set, at least in part simultaneous to performance of a second measurement phase for a second target frequency.

18. The method of claim 17, wherein the second target frequency is not an odd harmonic of the first target frequency.

19. The method of claim 17, further comprising:

upon completion of the bin selection and impedance identification for the second analysis frequency, determining whether the second measurement phase has completed; and based on the second measurement phase not being completed, repeating at least the bin selection and impedance identification of the analysis phase for a third analysis frequency that is an odd harmonic of the first target frequency, at least in part simultaneous to performance of the second measurement phase for the second target frequency.

20. The method of claim 17, further comprising:

upon completion of the bin selection and impedance identification for the second analysis frequency, determining whether the second measurement phase has completed; and based on the second measurement phase being completed, performing a new analysis phase comprising the data windowing, DFT computing, bin selecting, and impedance identifying, for a second measurement data set measured at the second target frequency.

* * * * *